United States Patent
Rajendran et al.

(10) Patent No.: US 9,595,919 B2
(45) Date of Patent: Mar. 14, 2017

(54) FRONT-END ARCHITECTURE FOR TRANSMITTER

(71) Applicant: QUALCOMM Incorporated, San Diego, CA (US)

(72) Inventors: Gireesh Rajendran, Bangalore (IN); Alok Prakash Joshi, Bangalore (IN); Ashish Lachhwani, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 14/752,608

(22) Filed: Jun. 26, 2015

(65) Prior Publication Data

US 2016/0380592 A1 Dec. 29, 2016

(51) Int. Cl.
*H03D 7/14* (2006.01)
*H04B 1/04* (2006.01)
*H03H 7/42* (2006.01)

(52) U.S. Cl.
CPC ............ *H03D 7/1425* (2013.01); *H03H 7/42* (2013.01); *H04B 1/04* (2013.01); *H04B 2001/0491* (2013.01)

(58) Field of Classification Search
CPC . H04B 1/04; H04B 2001/0491; H03D 7/1425
USPC ...................... 455/91, 114.1, 118, 120, 127.3
See application file for complete search history.

(56) References Cited

U.S. PATENT DOCUMENTS

| | | | | |
|---|---|---|---|---|
| 4,829,159 A * | 5/1989 | Braun | ................ | G05D 23/1913 219/483 |
| 6,404,263 B1 | 6/2002 | Wang | | |
| 7,433,662 B2 * | 10/2008 | Behzad | ................ | H03G 1/0029 330/278 |
| 8,358,991 B2 | 1/2013 | Chen et al. | | |
| 8,737,935 B2 * | 5/2014 | Afsahi | .................. | H03F 1/0222 455/103 |
| 8,941,441 B2 | 1/2015 | Testi et al. | | |
| 2007/0087710 A1 * | 4/2007 | Chou | .................... | H03D 7/1441 455/127.4 |
| 2008/0036532 A1 * | 2/2008 | Pan | ........................ | H03F 1/0205 330/51 |
| 2010/0102895 A1 * | 4/2010 | Beukema | ............ | H04L 27/0008 332/103 |
| 2011/0124302 A1 * | 5/2011 | Mattisson | ................ | H03C 3/40 455/113 |
| 2012/0013387 A1 | 1/2012 | Sankaranarayanan et al. | | |
| 2013/0137386 A1 * | 5/2013 | Sivonen | ................ | H04B 1/109 455/90.2 |
| 2014/0235187 A1 | 8/2014 | Vidojkovic et al. | | |

(Continued)

FOREIGN PATENT DOCUMENTS

DE          3409555 A1     10/1984

OTHER PUBLICATIONS

International Search Report and Written Opinion—PCT/US2016/033962—ISA/EPO—Sep. 7, 2016.

*Primary Examiner* — Tuan Pham
(74) *Attorney, Agent, or Firm* — Procopio, Cory, Hargreaves & Savitch, LLP

(57) ABSTRACT

Apparatus includes: a mixer configured to mix local a oscillator signal with a baseband signal and output a radio frequency (RF) signal; a first load coupled to the mixer and tuned to an operating frequency; and a second load coupled to the mixer and tuned to a predetermined multiple of the operating frequency.

20 Claims, 10 Drawing Sheets

(56) References Cited

U.S. PATENT DOCUMENTS

2014/0340151 A1 11/2014 Van Sinderen et al.
2015/0017938 A1 1/2015 Rofougaran
2015/0044979 A1 2/2015 Seckin et al.

* cited by examiner

FRONT-END ARCHITECTURE FOR TRANSMITTER

BACKGROUND

Field

This disclosure relates generally to transmitter front-end blocks, and more specifically, to mixer-driver amplifier implementations of the transmitter front-end block.

Background

The growth of portable wireless devices is driving the requirements for smaller building blocks and electronic components, which entail designing area efficient blocks. In a transmitter of a wireless device, front-end blocks such as up-conversion mixer and driver amplifier are designed to achieve highest gain at the lowest power. However, cascaded stages of the transmitter front-end block may generate higher variation in gain and higher area requirement due to tuned inductor-capacitor (LC) load at the operating frequency. Other configurations of the conventional transmitter front-end block may be limited by the headroom available for a mixer output due to cascode devices. Further, a conversion loss and I-Q combining may produce efficiency loss.

SUMMARY

The present disclosure describes various implementations of a transmitter front-end block.

In one embodiment, an apparatus is disclosed. The apparatus includes: a mixer configured to mix a local oscillator signal with a baseband signal and output a radio frequency (RF) signal; a first load coupled to the mixer and tuned to an operating frequency; and a second load coupled to the mixer and tuned to a predetermined multiple of the operating frequency.

In another embodiment, an apparatus is disclosed. The apparatus includes: a mixer core configured to receive and mix a local oscillator signal with a baseband signal and output a differential RF signal; a first load coupled to the mixer core and configured to tune the first load to an operating frequency; and a second load coupled to the mixer core and configured to tune the second load to a predetermined multiple of the operating frequency.

In yet another embodiment, an apparatus is disclosed. The apparatus includes: mixing means configured to mix a local oscillator signal with a baseband signal and output an RF signal; first loading means coupled to the mixing means and tuned to an operating frequency; second loading means coupled to the mixing means and tuned to a predetermined multiple of the operating frequency; and amplifying means configured to receive and amplify the output RF signal from the mixing means.

Other features and advantages of the present disclosure should be apparent from the present description which illustrates, by way of example, aspects of the disclosure.

BRIEF DESCRIPTION OF THE DRAWINGS

The details of the present disclosure, both as to its structure and operation, may be gleaned in part by study of the appended further drawings, in which like reference numerals refer to like parts, and in which.

DETAILED DESCRIPTION

As stated above, conventional designs of a transmitter front-end block of a wireless device generate higher variations in gain, higher area requirement, and are limited by the headroom available for a mixer output.

Certain embodiments as described herein provide for a transmitter front-end block configuration which addresses the shortcomings of the conventional designs and provides advantages including higher output power, better efficiency and low power output variation across process and temperature. After reading this description it will become apparent how to implement the disclosure in various implementations and applications. Although various implementations of the present disclosure will be described herein, it is understood that these implementations are presented by way of example only, and not limitation. As such, this detailed description of various implementations should not be construed to limit the scope or breadth of the present disclosure.

The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
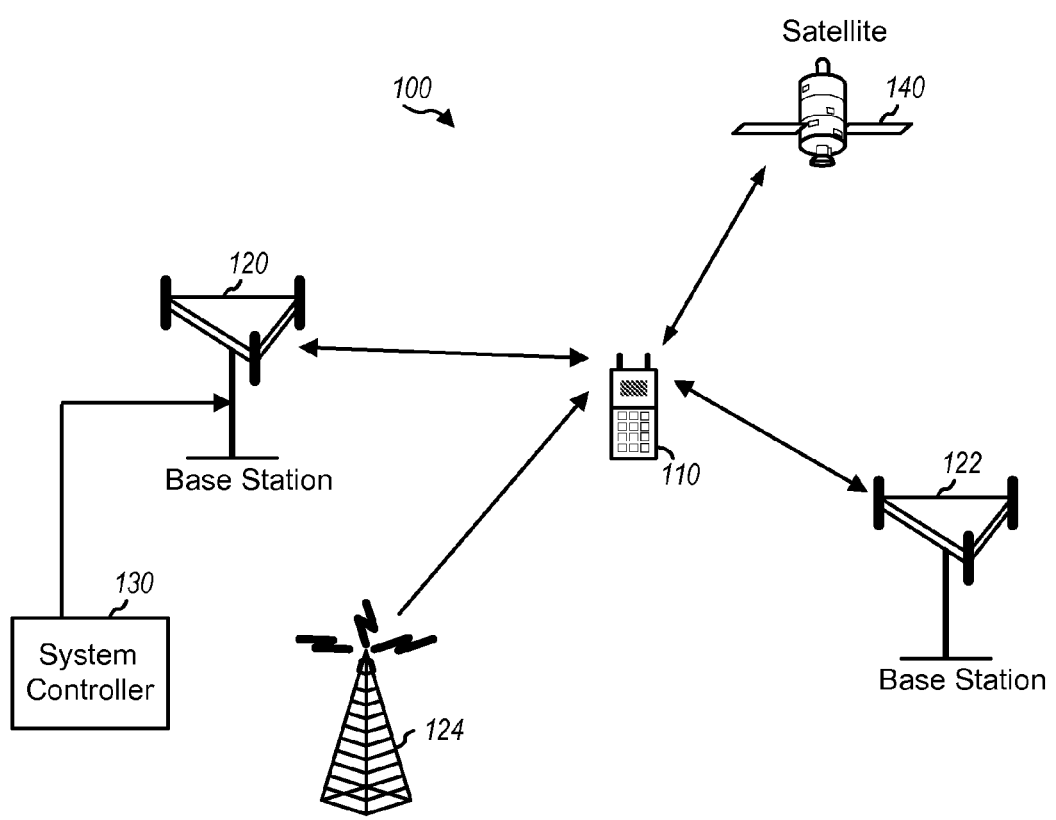
FIG. 1 is an exemplary wireless device communicating with a wireless communication system.

FIG. 1 is an exemplary wireless device 110 communicating with a wireless communication system 100. Wireless communication system 100 may be a Long Term Evolution (LTE) system, a Code Division Multiple Access (CDMA)

system, a Global System for Mobile Communications (GSM) system, a wireless local area network (WLAN) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless system 100 including two base stations 120 and 122 and one system controller 130. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 100. Wireless device 110 may also receive signals from broadcast stations (e.g., broadcast station 124), signals from satellites (e.g., satellite 140) in one or more global navigation satellite systems (GNSS), etc. Wireless device 110 may support one or more radio technologies for wireless communication such as LTE, WCDMA, CDMA 1×, EVDO, TD-SCDMA, GSM, 802.11, etc.

Figure 2:
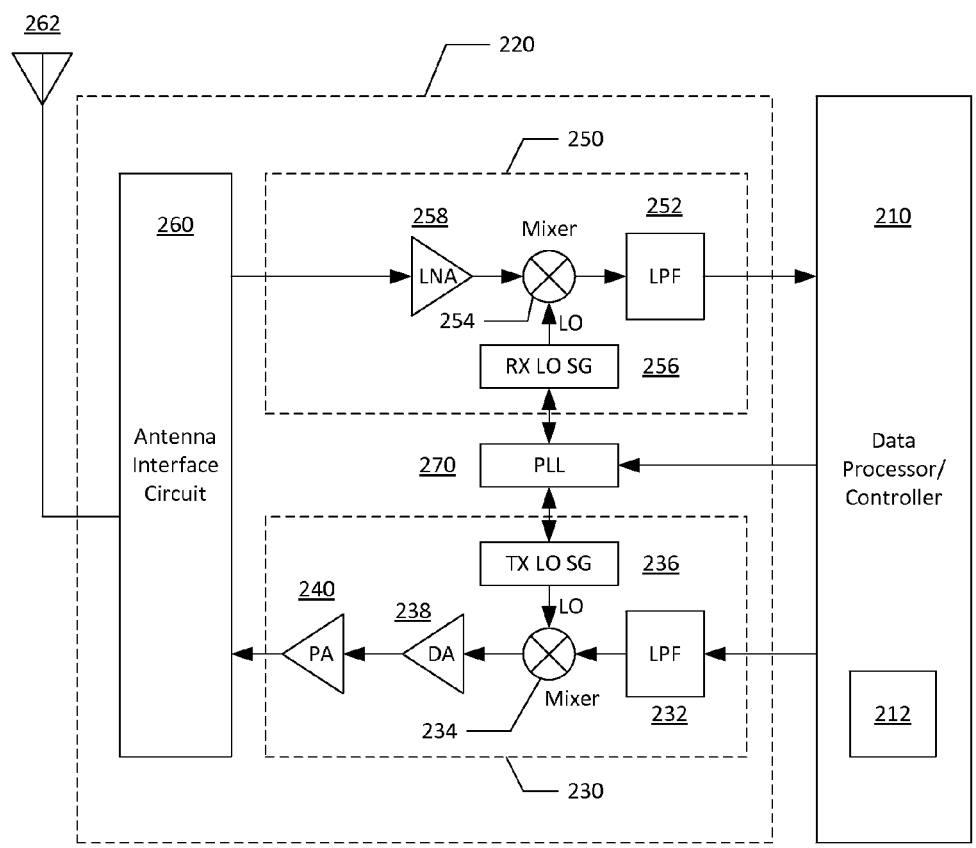
FIG. 2 is a functional block diagram of an exemplary design of a wireless device that is one embodiment of a wireless device of FIG. 1.

FIG. 2 is a functional block diagram of an exemplary design of a wireless device 200 that is one embodiment of a wireless device 110 of FIG. 1. In this exemplary design, the wireless device 200 includes a transceiver 220 and a data processor 210 having a memory unit 212 to store data and program codes. The transceiver 220 includes a transmitter 230 and a receiver 250 that support bi-directional communication. In general, the wireless device 200 may include any number of transmitters and any number of receivers for any number of communication systems and frequency bands.

A transmitter or a receiver may be implemented with a super-heterodyne architecture or a direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the design shown in FIG. 2, transmitter 230 and receiver 250 are implemented with the direct-conversion architecture.

In the transmit path, the data processor 210 processes data to be transmitted and provides in-phase (I) and quadrature-phase (Q) analog output signals to the transmitter 230. Within the transmitter 230, a lowpass filter (LPF) 232 filters the I and Q analog output signals to remove undesired images caused by the prior digital-to-analog conversion. An amplifier (not shown) can be configured after the LPF 232 to amplify the signals from the LPF and provide I and Q baseband signals. An up-converter/mixer 234 up-converts the I and Q baseband signals with I and Q transmit (TX) local oscillating (LO) signals from a TX LO signal generator 236 and provides an up-converted signal. A driver amplifier (DA) 238 and a power amplifier (PA) 240 amplify the signal from the up-converter/mixer 234 to obtain the desired output power level and provides a transmit RF signal. The transmit RF signal is routed through an antenna interface circuit 260 and transmitted via an antenna 262.

In the receive path, antenna 262 receives signals transmitted by base stations and provides a received RF signal, which is routed through the antenna interface circuit 260 and provided to a low noise amplifier (LNA) 258. The received RF signal is amplified by the LNA 258. A down-converter/mixer 254 down-converts the RF input signal with I and Q receive (RX) LO signals from an RX LO signal generator 256 and provides I and Q baseband signals. The I and Q baseband signals are filtered by a lowpass filter 252 to obtain I and Q analog input signals, which are provided to the data processor 210.

The TX LO signal generator 236 generates I and Q TX LO signals used for frequency up-conversion. The RX LO signal generator 256 generates I and Q RX LO signals used for frequency down-conversion. Each LO signal is a periodic signal with a particular fundamental frequency. A PLL 270 receives timing information from data processor 210 and generates a control signal used to adjust the frequency and/or phase of the LO signals from the LO signal generators 236, 256.

Figure 3:
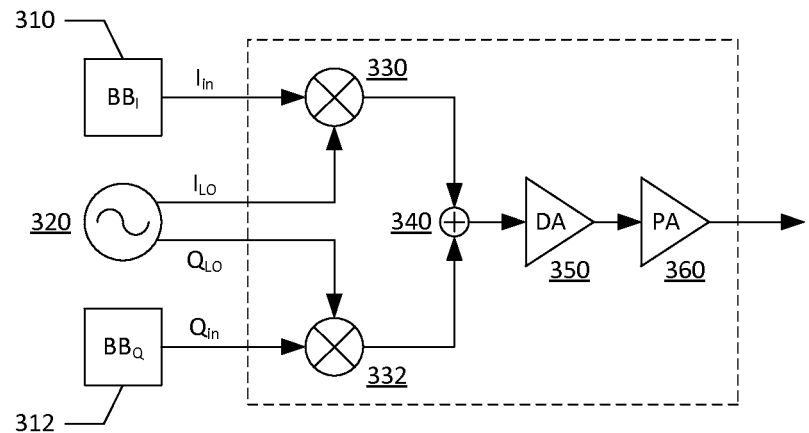
FIG. 3 is a simplified functional block diagram of a transmitter that operates at millimeter-wave frequencies.

For a radio transmitter (e.g., transmitter 230 used in wireless device 200) operating at millimeter-wave frequencies, the most challenging tasks are design and implementation of the front-end blocks operating directly at the radio frequency. FIG. 3 is a simplified functional block diagram of a transmitter 300 that operates at millimeter-wave frequencies. The signal to be transmitted is first processed by the baseband (BB) blocks 310, 312. The processed signals ($I_{in}$, $Q_{in}$) are then up-converted (e.g., multiplied by $I_{LO}$ and $Q_{LO}$ from local oscillator 320) by mixers 330, 332, respectively, from baseband frequencies to RF frequencies. The I and Q modulated RF signals are summed together by a summing unit 340 to form a modulated RF signal, which is then amplified by the driver amplifier (DA) 350 and the power amplifier (PA) 360. The amplified RF signal is transmitted via the antenna.

Figure 4:
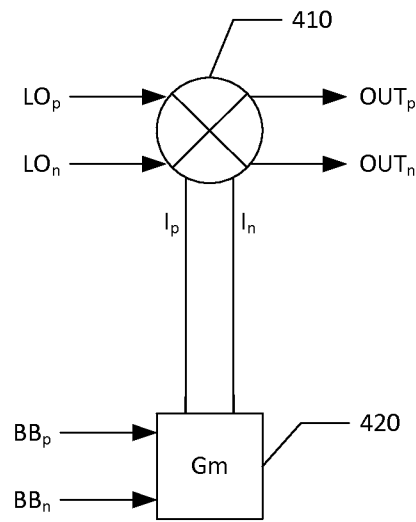
FIG. 4 is a functional diagram of a mixer-transconductance block including a mixer block and a transconductance (Gm) block.

FIG. 4 is a functional diagram of a mixer-transconductance block 400 including a mixer block 410 and a transconductance (Gm) block 420. In FIG. 4, a mixer block 410 is configured to mix or multiply a first differential input voltage (local oscillator signal ($LO=LO_p-LO_n$)) with a mixer differential input current ($I=I_p-I_n$) to generate a differential output signal ($OUT=OUT_p-OUT_n$), which may be a differential voltage or differential current. The differential input current (I) is generated by the Gm block 420, which is designed to cause the differential input current (I) to be linearly proportional to a second differential input voltage (e.g., a baseband signal ($BB=BB_p-BB_n$)) over a suitable range. Accordingly, the mixer-transconductance block 400 effectively mixes the first differential input voltage (LO signal) with the second differential input voltage (BB signal) to generate the differential output signal (OUT). The magnitude of the OUT signal relative to the LO signal and the BB signal is characterized by the gains of the mixer block 410 and the Gm block 420.

Figure 5:
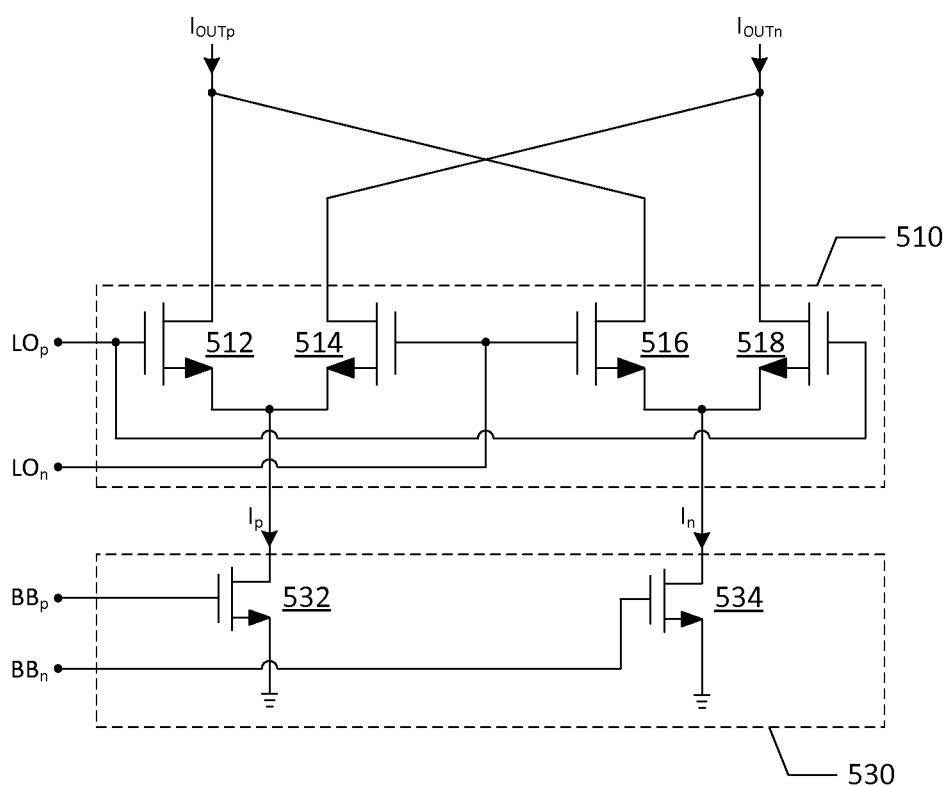
FIG. 5 is a schematic diagram of an exemplary double-balanced differential mixer including a mixer block and a transconductance (Gm) block (e.g., a voltage-to-current converter)

FIG. 5 is a schematic diagram of an exemplary double-balanced differential mixer 500 including a mixer block 510 and a transconductance (Gm) block 530 (e.g., a voltage-to-current converter). In one embodiment, the mixer-transconductance block 400 of FIG. 4 can be configured as the double-balanced differential mixer-transconductance block 500 of FIG. 5.

In FIG. 5, the Gm block 530 includes transistors 532 and 534 configured to receive and convert the BB signals, $BB_p$ and $BB_n$, into currents $I_p$ and $I_n$, respectively. The current $I_p$ is provided to a first differential pair including transistors 512, 514, while the current $I_n$ is provided to a second differential pair including transistors 516, 518. The first and second differential pairs collectively form the mixer block 510, and multiply the input LO signals, $LO_p$ and $LO_n$, with the currents $I_p$ and $I_n$ generated by the Gm block 530. The outputs of the first and second differential pairs are cross-coupled to generate a differential output current ($I_{OUT} = I_{OUTp} - I_{OUTn}$). Thus, the output includes both sidebands as well as other frequencies originating from the mixing process.

Figure 6A:
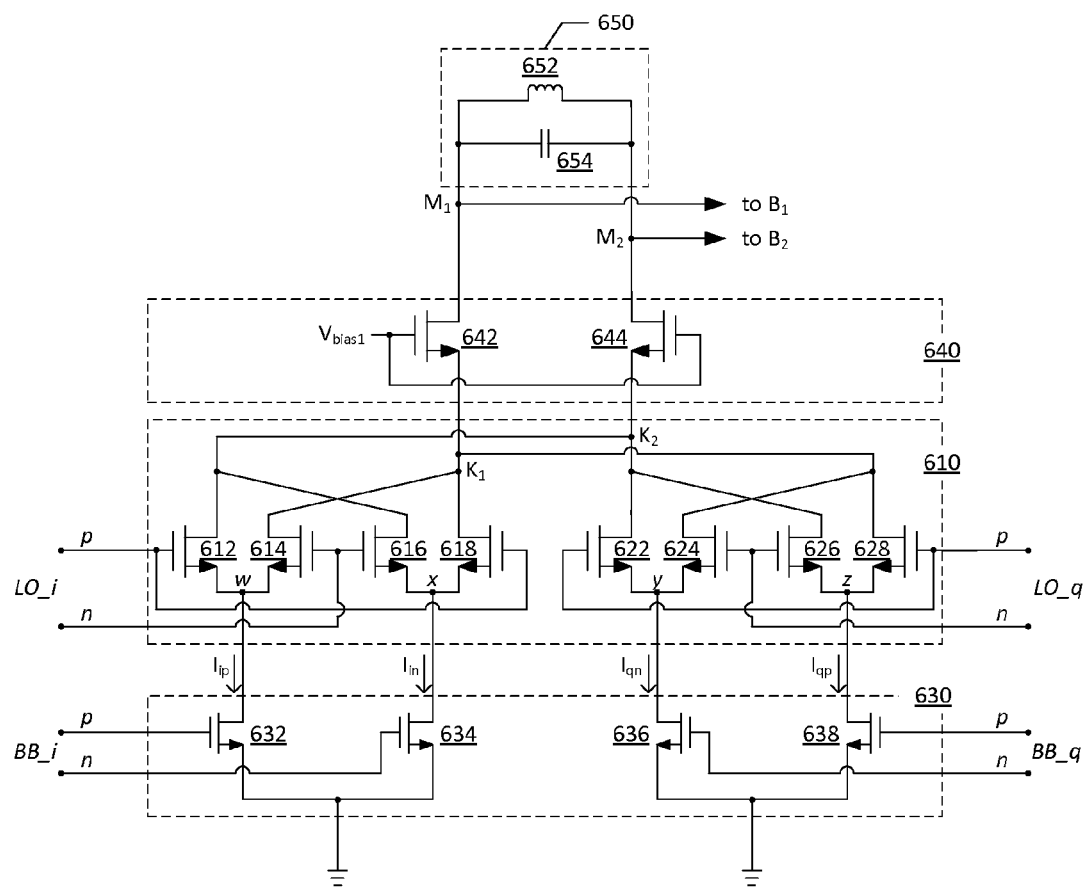
FIG. 6A is a detailed schematic diagram of an exemplary double-balanced differential mixer in accordance with one embodiment of the present disclosure.

FIG. 6A is a detailed schematic diagram of an exemplary double-balanced differential mixer 600 in accordance with one embodiment of the present disclosure. In FIG. 6A, the mixer 600 is configured to be placed in a transmitter front-end which upconverts an intermediate frequency (IF) signal to a radio frequency (RF) signal. However, the mixer 600 can be configured to be placed in a receiver to downconvert an RF signal to an IF signal.

In the illustrated embodiment of FIG. 6A, the mixer 600 includes a mixer block 610, a Gm block 630, a cascode block 640, and a tuned load 650. Further, the mixer 600 is configured to mix both in-phase and quadrature phase components of the LO signal with those of the BB signal. The mixer block 610 includes a first differential pair of transistors 612, 614, a second differential pair of transistors 616, 618, a third differential pair of transistors 622, 624, and a fourth differential pair of transistors 626, 628. The Gm block 630 includes transistor pair 632, 634 to process the in-phase components of the BB signal and transistor pair 636, 638 to process the quadrature phase components of the BB signal. The cascode block 640 includes transistor pair 642, 644. The tuned load 650 includes inductor 652 and capacitor 654.

In FIG. 6A, the in-phase components of the BB signal, $BB\_I_p$ and $BB\_I_n$, are applied to the gate terminals of the transistor pair 632, 634 of the Gm block 630 to generate a pair of in-phase current signals, $I_{ip}$ and $I_{in}$, respectively, while the quadrature phase components of the BB signal, $BB\_Q_p$ and $BB\_Q_n$, are applied to the gate terminals of the transistor pair 638, 636 of the Gm block 630 to generate a pair of quadrature phase current signals, $I_{qp}$ and $I_{qn}$, respectively. The drain terminals of transistors 632, 634, 636, 638 are coupled to the source terminals of the first differential pair of transistors 612, 614, the second differential pair of transistors 616, 618, the third differential pair of transistors 622, 624, and the fourth differential pair of transistors 626, 628, respectively.

The generated in-phase ($I_{ip}$ and $I_{in}$) and quadrature phase current signals ($I_{qn}$ and $I_{qp}$) flow into the mixer block 610 through nodes w, x, y, z, respectively. The source terminals of the first differential pair of transistors 612, 614 couple to node w. The source terminals of the second differential pair of transistors 616, 618 couple to node x. The source terminals of the third differential pair of transistors 622, 624 couple to node y. The source terminals of the fourth differential pair of transistors 626, 628 couple to node z. The positive in-phase component of the LO signal ($LO\_I_p$) is applied to the gate terminals of the transistors 612, 618, while the negative in-phase component of the LO signal ($LO\_I_n$) is applied to the gate terminals of the transistors 614, 616. The positive quadrature phase component of the LO signal ($LO\_Q_p$) is applied to the gate terminals of the transistors 622, 628, while the negative quadrature phase component of the LO signal ($LO\_Q_n$) is applied to the gate terminals of the transistors 624, 626. Since the gate terminals of the transistors 612-628 are driven by rail-to-rail LO signals, the transistors behave as switches. The drain terminal of each of the transistors 612-628 couples to one of nodes $K_1$, $K_2$, which couple to the source terminals of the transistors 642, 644 in the cascode block 640. The drain terminals of transistors 614, 618, 624, 628 couple to node $K_1$, while the drain terminals of transistors 612, 616, 622, 626 couple to node $K_2$. The gate terminals of the transistors 642, 644 in the cascode block 640 receive a first bias voltage ($V_{bias1}$). The drain terminals of the transistors 642, 644 couple to nodes $M_1$, $M_2$, respectively, which are input terminals of the tuned load 650. The tuned load 650 includes an inductor 652 and a capacitor 654 configured to tune the inductor-capacitor (LC) load to an operating frequency. Nodes $M_1$, $M_2$ couple to nodes $B_1$, $B_2$ in the driver amplifier 660 (of FIG. 6B; similar to block 238 in FIG. 2) of the next stage of the transmitter front end (e.g., block 230 shown in FIG. 2). In one embodiment, the transistors 642, 644 in the cascode block 640 are configured to isolate the loading of the following stage.

Figure 6B:
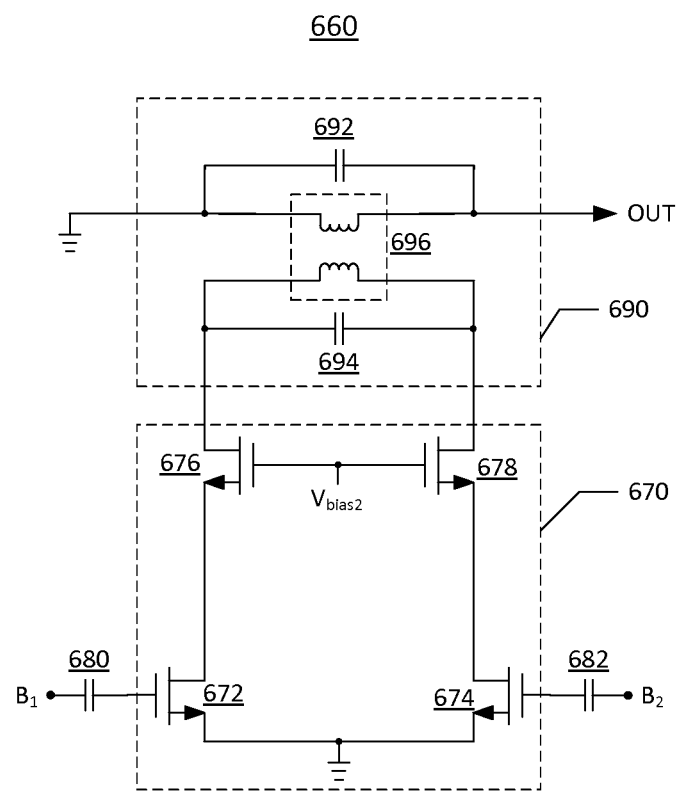
FIG. 6B is a detailed schematic diagram of an exemplary driver amplifier in accordance with one embodiment of the present disclosure.

FIG. 6B is a detailed schematic diagram of an exemplary driver amplifier 660 in accordance with one embodiment of the present disclosure. In the illustrated embodiment of FIG. 6B, output nodes $M_1$, $M_2$ of the mixer 600 (of FIG. 6A) couple to nodes $B_1$, $B_2$, respectively, in the driver amplifier 660. In the illustrated embodiment of FIG. 6B, the driver amplifier 660 includes an amplifier block 670 and a tuned LC load 690. The amplifier block 670 includes a pair of differential transistors 672, 674 configured to receive the output of the up-converter/mixer 600 at the gate terminals through alternating current (AC) coupling capacitors 680, 682. The AC coupling capacitors 680, 682 are also coupled to nodes B1, B2, respectively. The cascode transistors 676, 678 function in combination with a tuned load 690 as loads for the input transistors 672, 674. The tuned load 690 includes capacitors 692, 694 and a balun 696, which converts the differential output into a single-ended output (OUT).

In FIG. 6A and FIG. 6B, the transmitter front-end includes the mixer 600 (FIG. 6A) and the driver amplifier (DA) 660 (FIG. 6B). The mixer 600 includes the corresponding tuned LC load 650, while the DA 660 includes the corresponding tuned LC load 690. The cascaded stages of the mixer-DA combination in the transmitter front-end provide good efficiency. However, the cascaded stages of the transmitter front-end generate higher variation in gain and higher area requirement due to the tuned LC load to an operating frequency. Accordingly, another exemplary transmitter front-end design is proposed. This design includes a mixer that directly drives an output load and a driver amplifier. Further, a negative transconductance cell is used to boost the power level to a maximum to compensate for the balun loss.

Figure 7A:
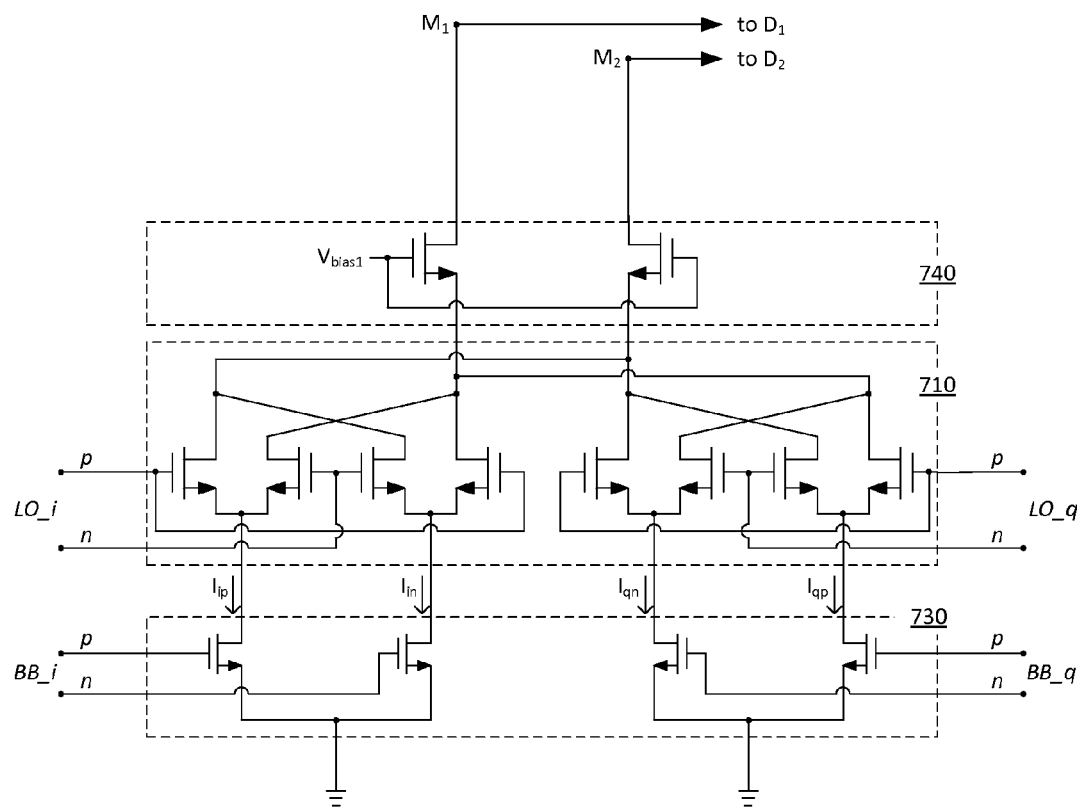
FIG. 7A is a detailed schematic diagram of an exemplary double-balanced differential mixer in accordance with another embodiment of the present disclosure.

FIG. 7A is a detailed schematic diagram of an exemplary double-balanced differential mixer 700 in accordance with another embodiment of the present disclosure. In the illustrated embodiment of FIG. 7A, the mixer 700 includes a mixer block 710, a Gm block 730, and a cascode block 740. However, missing from the mixer 700 compared to the mixer 600 is the tuned load 650, because the mixer 700 is configured to directly drive the output load. Nodes $M_1$, $M_2$ couple to nodes $D_1$, $D_2$ in the driver amplifier 760 (of FIG. 7B; similar to block 238 in FIG. 2) of the next stage of the transmitter front end (e.g., block 230 in FIG. 2). Elements within the mixer block 710, the Gm block 730, and the cascode block 740 are configured and/or operated similarly to the corresponding elements within the blocks of FIG. 6A.

Figure 7B:
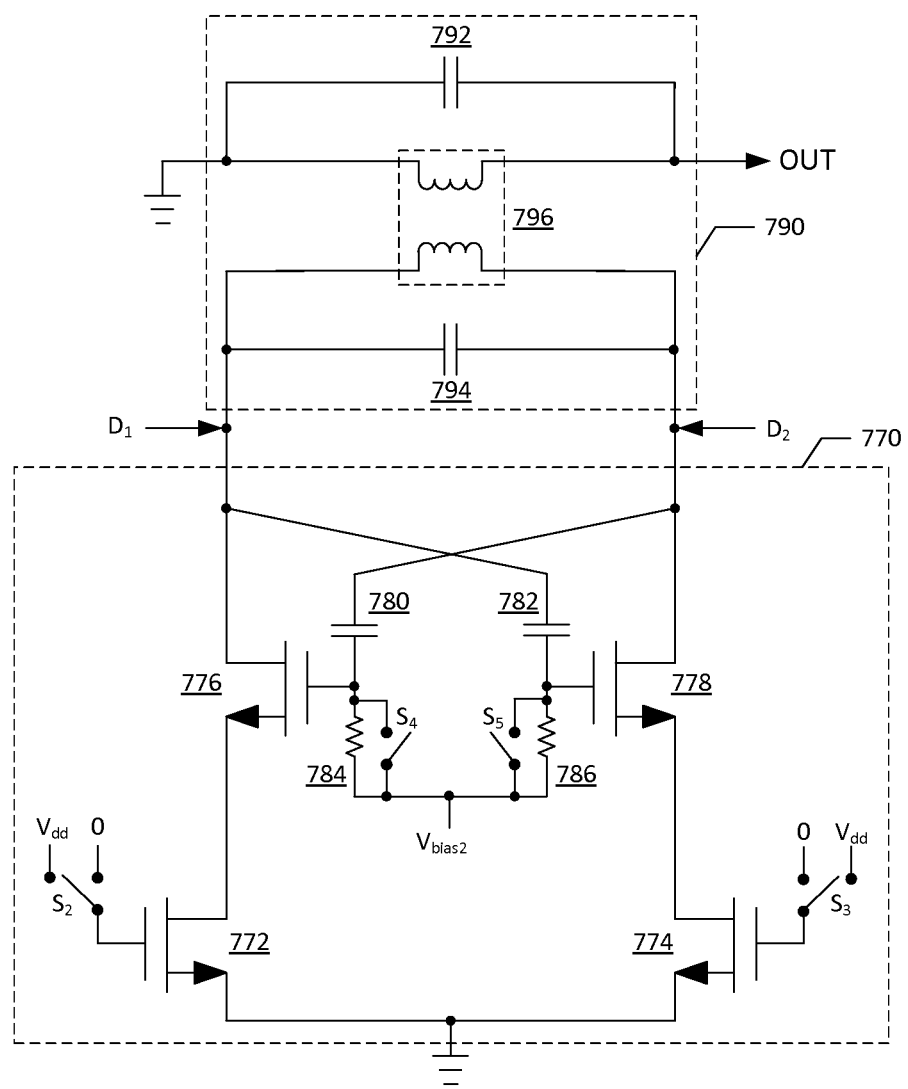
FIG. 7B is a detailed schematic diagram of an exemplary driver amplifier in accordance with another embodiment of the present disclosure.

FIG. 7B is a detailed schematic diagram of an exemplary driver amplifier 760 in accordance with another embodiment of the present disclosure. In the illustrated embodiment of FIG. 7B, output nodes $M_1$, $M_2$ of the mixer 700 couple to nodes $D_1$, $D_2$, respectively, in the driver amplifier 760. In the illustrated embodiment of FIG. 7B, the driver amplifier 760 includes an amplifier block 770 and a tuned LC load 790. The tuned load 790 includes capacitors 792, 794 and a balun 796, which converts the differential output into a single-ended output (OUT). The amplifier block 770 is configured as a negative transconductance (Gm) cell including a pair of differential input transistors 772, 774 and a pair of cross-coupled transistors 776, 778 configured as a cascode structure. As stated above, the negative Gm cell is used to boost the power level to a maximum to compensate for the balun loss.

The gate terminals of the input transistors 772, 774 are configured to be switched between the ground voltage and the supply voltage ($V_{dd}$). Switches $S_2$ and $S_3$ enable the switching between the ground voltage and the supply voltage. The cross-coupled pair of cascode transistors 776, 778 function in combination with capacitors 792, 794 and inductors (primary and secondary windings of the balun 796) as loads for the input transistors 772, 774. The gate terminals of the cascode transistors 776, 778 are cross-coupled through capacitors 780, 782. Further, resistors 784, 786 are placed in parallel to the cross-coupled capacitors 780, 782. Resistors 784, 786 couple to each other through a bias voltage ($V_{bias2}$). However, the resistors 784, 786 can be bypassed with switches $S_4$, $S_5$, respectively.

Although the configuration of the transmitter front-end shown in FIG. 7A and FIG. 7B provides a low output power variation and good noise performance, this configuration may be limited by the headroom available for mixer output due to cascaded devices. Further, a conversion loss and I-Q combining produces efficiency loss. Accordingly, yet another exemplary transmitter front-end configuration (FIG. 8A and FIG. 8B) is proposed. This configuration provides advantages including higher output power and better efficiency, which can be achieved for the same output power dynamically with the noise trade-off. The advantages also include low power output variation across process and temperature since the additional gain variation factor compared to the power mixer is a well-controlled ratio of transconductance.

Figure 8A:
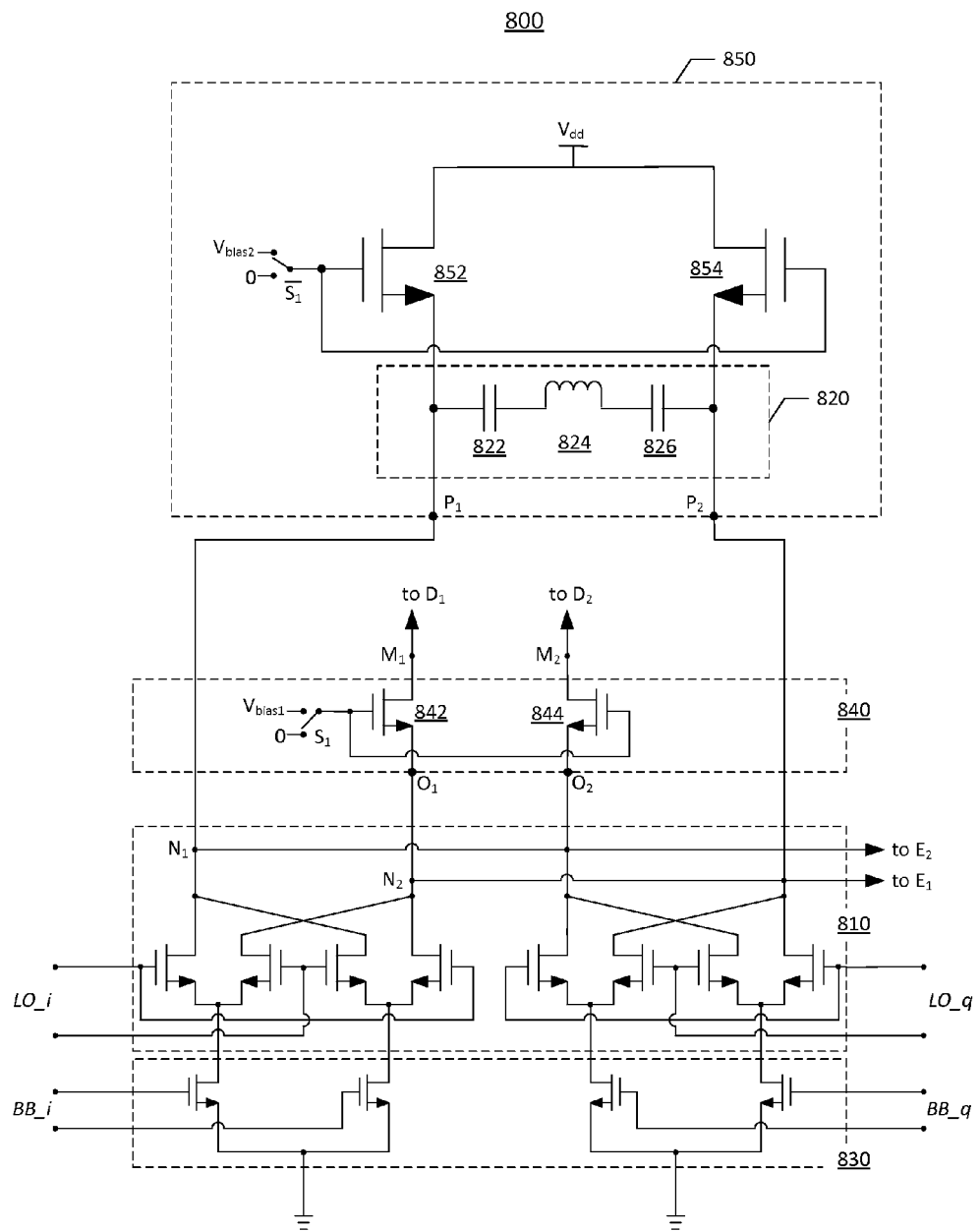
FIG. 8A is a detailed schematic diagram of an exemplary double-balanced differential mixer in accordance with yet another embodiment of the present disclosure.

FIG. 8A is a detailed schematic diagram of an exemplary double-balanced differential mixer 800 in accordance with yet another embodiment of the present disclosure. In the illustrated embodiment of FIG. 8A, the mixer 800 includes a mixer block (or mixer core) 810, a Gm block 830, and a cascode block 840. Again, missing from the mixer 800 compared to the mixer 600 is the tuned load 650, because the mixer 800 is configured to directly drive the output load. Nodes $M_1$, $M_2$ couple to nodes $D_1$, $D_2$ in the driver amplifier 860 (of FIG. 8B; similar to block 238 in FIG. 2) of the next stage of the transmitter front end (e.g., block 230 in FIG. 2).

In one embodiment, switch S1 connects to the gate terminals of transistors 842, 844 in the cascode block 840. When switch $S_1$ is enabled, the cascode transistors 842, 844 of the cascode block 840 function as a load for the mixer block 810. In the illustrated embodiment of FIG. 8A, the mixer 800 includes additional items such as switches $S_1$, $\overline{S_1}$ and a mixer load 850. Switches $S_1$, $\overline{S_1}$ are complementary switches such that when one is enabled, the other is disabled, and vice versa. The selection of switches $S_1$ or $\overline{S_1}$ depends on the power level of the transmitter front end design. Elements within the mixer block 810, the Gm block 830, and the cascode block 840 that were not discussed in this paragraph are configured and/or operated similarly to the corresponding elements within the blocks of FIG. 6A. When switch $\overline{S_1}$ is enabled (transistors 852, 854 are activated) and switch $S_1$ is disabled (transistors 842, 844 are de-activated), the output of the mixer block 810 (nodes $N_1$, $N_2$) is sent to the input nodes ($P_1$, $P_2$) of the mixer load 850, which is configured as a pair of cascode transistors 852, 854 and a notch filter 820. The notch filter 820 includes a pair of capacitors 822, 826 and an inductor 824 to tune the mixer load 850. The values of the capacitors 822, 826 and the inductor 824 are selected to tune the mixer load 850 to a predetermined multiple (e.g., three times) of an operating frequency. Tuning the notch filter 820 to three times (3×) the operating frequency, for example, improves distortion due to harmonic mixing in the driver amplifier 860. Since the notch filter 820 is configured to tune the mixer load 850 at the 3× operating frequency (which enables nine times reduction in the inductor value), the inductor area can be made small. In other embodiments, the notch filter can be tuned to any multiple of the operating frequency so long as it enables reduction in the inductor area.

Outputs of nodes $N_1$, $N_2$ of the mixer block 810 are also sent to nodes E2, E1, respectively, of the driver amplifier 860. When switch $\overline{S_1}$ is disabled (transistors 852, 854 are de-activated) and switch $S_1$ is enabled (transistors 842, 844 are activated), the output of the mixer block 810 (nodes $N_1$, $N_2$) is sent to the input nodes ($O_1$, $O_2$) of the cascode block 840.

Figure 8B:
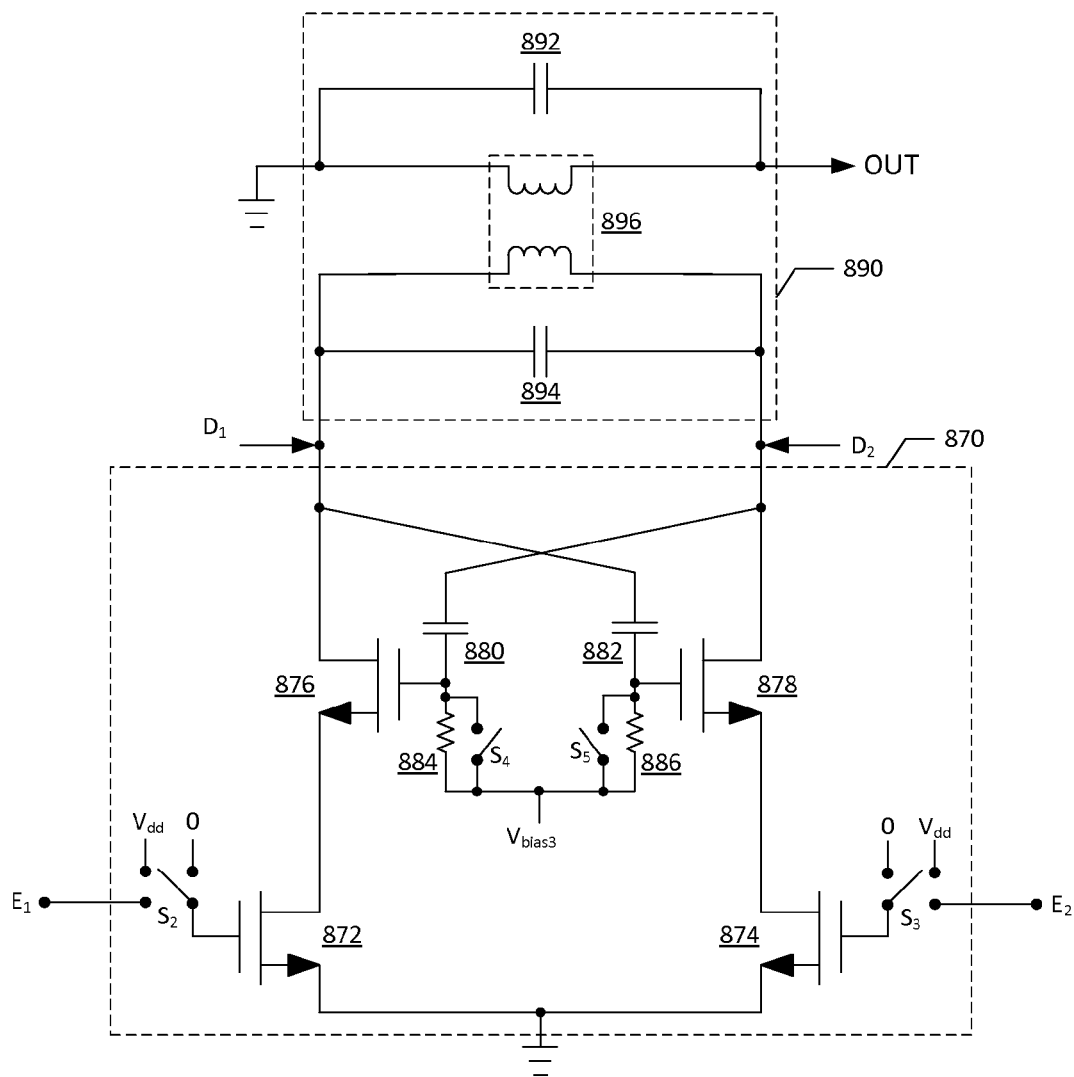
FIG. 8B is a detailed schematic diagram of an exemplary driver amplifier coupled to the exemplary double-balanced differential mixer in accordance with yet another embodiment of the present disclosure.

FIG. 8B is a detailed schematic diagram of an exemplary driver amplifier 860 coupled to the exemplary double-balanced differential mixer 800 (shown in FIG. 8A) in accordance with yet another embodiment of the present disclosure. In the illustrated embodiment of FIG. 8B, output nodes $M_1$, $M_2$ of the mixer 800 couple to nodes $D_1$, $D_2$, respectively, in the driver amplifier 860. In the illustrated embodiment of FIG. 8B, the driver amplifier 860 includes an amplifier block 870 and a tuned LC load 890. The tuned load 890 includes capacitors 892, 894 and a balun 896, which converts the differential output into a single-ended output (OUT). The amplifier block 870 is configured as a negative transconductance (Gm) cell including a pair of differential input Gm transistors 872, 874 and a pair of high-voltage cross-coupled transistors 876, 878 configured as a cascode structure. As stated above, the negative Gm cell is used to boost the power level to a maximum to compensate for the balun loss.

The gate terminals of the input transistors 872, 874 are configured to be switched between the ground voltage, the supply voltage ($V_{dd}$), and outputs $N_2$, $N_1$ of the mixer block 810 received at nodes $E_1$, $E_2$, respectively. The inputs to the gate terminals of the transistors 872, 874 are selected by switches $S_2$, $S_3$, respectively. The pair of cross-coupled cascode transistors 876, 878 function in combination with capacitors 892, 894 and inductors (primary and secondary windings of the balun 896) as loads for the input transistors 872, 874. The gate terminals of the cascode transistors 876, 878 are cross-coupled through capacitors 880, 882. Further, resistors 884, 886 are placed in parallel to the cross-coupled capacitors 880, 882. Resistors 884, 886 couple to each other through a bias voltage ($V_{bias3}$). However, the resistors 884, 886 can be bypassed with switches $S_4$, $S_5$, respectively.

The configuration of FIG. 8A and FIG. 8B provides advantages including higher output power and better efficiency, which can be achieved for the same output power dynamically with the noise trade-off. The advantages also include low power output variation across process and temperature since the additional gain variation factor compared to the power mixer is a well-controlled ratio of transconductance. Although several embodiments of the disclosure are described above, many variations of the disclosure are possible. For example, although the illustrated embodiments of a transmitter front-end shown in FIGS. 8A and 8B show several blocks including mixer block 810, Gm block 830, cascode block 840, mixer load 850, an amplifier block 870, and a tuned LC load 890, some of the blocks can be left out. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system Skilled persons can implement the described functionality in varying ways for each particular application, but such implementation decisions should not be interpreted as causing a departure from the scope of the disclosure. In addition, the grouping of functions within a module, block, or step is for ease of description. Specific functions or steps can be moved from one module or block without departing from the disclosure.

The above description of the disclosed embodiments is provided to enable any person skilled in the art to make or use the disclosure. Various modifications to these embodiments will be readily apparent to those skilled in the art, and the generic principles described herein can be applied to other embodiments without departing from the spirit or scope of the disclosure. Thus, it is to be understood that the description and drawings presented herein represent presently preferred embodiments of the disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

What is claimed is:

1. An apparatus for mixing local oscillator signals with baseband signals, the apparatus comprising:
    a mixer configured to mix a local oscillator signal with a baseband signal and output a radio frequency (RF) signal;
    a first load coupled to the mixer and configured to operate at an operating frequency;
    a second load coupled to the mixer and tuned to a predetermined multiple of the operating frequency; and
    at least one switch configured to switch between the first load and the second load based on a power level of the apparatus.

2. An apparatus for mixing local oscillator signals with baseband signals, the apparatus comprising:
    a mixer core configured to receive and mix a local oscillator signal with a baseband signal and output a differential RF signal;
    a first load coupled to the mixer core and configured to operate the first load at an operating frequency;
    a second load coupled to the mixer core and configured to tune the second load to a predetermined multiple of the operating frequency; and
    at least one switch configured to switch between the first load and the second load based on a power level of the apparatus.

3. The apparatus of claim 2, wherein the first load comprises
    a first pair of cascode transistors coupled to the mixer core and the at least one switch.

4. The apparatus of claim 3, wherein the at least one switch comprises
    a first switch coupled to gate terminals of the first pair of cascode transistors.

5. The apparatus of claim 2, wherein the second load comprises
    a second pair of cascode transistors coupled to the mixer core and the at least one switch.

6. The apparatus of claim 5, wherein the at least one switch comprises
    a second switch coupled to gate terminals of the second pair of cascode transistors.

7. The apparatus of claim 5, wherein the second load comprises a notch filter coupled to the second pair of cascode transistors and configured to tune the second load to the predetermined multiple of the operating frequency.

8. The apparatus of claim 7, wherein the predetermined multiple of the operating frequency is three times the operating frequency.

9. The apparatus of claim 2, wherein the mixer core comprises
    a transconductance unit configured to receive and convert the baseband signal from a voltage signal to a current signal.

10. The apparatus of claim 2, wherein the mixer core comprises:
    first and second pairs of differential transistors configured in a cross-coupled architecture to process and mix in-phase components of the local oscillator signal with in-phase components of the baseband signal; and
    third and fourth pairs of differential transistors configured in the cross-coupled architecture to process and mix quadrature phase components of the local oscillator signal with quadrature phase components of the baseband signal.

11. The apparatus of claim 2, further comprising:
    a driver amplifier configured to receive and amplify the output differential RF signal from the mixer core; and
    a third load coupled to the driver amplifier and the first load, the third load configured to convert the output differential RF signal to a single-ended RF signal.

12. The apparatus of claim 11, wherein the driver amplifier comprises:
    a pair of input transistors coupled to the mixer core; and
    a pair of cross-coupled transistors coupled to the pair of input transistors.

13. The apparatus of claim 12, further comprising
    at least one switch coupled to gate terminals of the pair of input transistors, the at least one switch configured to switch between a ground voltage, a supply voltage, and the output differential RF signal from the mixer core.

14. The apparatus of claim 12, further comprising:
    a pair of capacitors cross-coupled between gate terminals and drain terminals of the pair of cross-coupled transistors; and
    at least one resistor coupled between the gate terminals of the pair of cross-coupled transistors.

15. The apparatus of claim 14, further comprising
    at least one switch coupled to the at least one resistor to bypass the at least one resistor.

16. The apparatus of claim 11, wherein the third load comprises:

a balun having a primary winding and a secondary winding;

a first capacitor coupled to the primary winding; and a second capacitor coupled to the secondary winding.

17. An apparatus for mixing local oscillator signals with baseband signals, the apparatus comprising:

mixing means configured to mix a local oscillator signal with a baseband signal and output an RF signal;

first loading means coupled to the mixing means and configured to operate at an operating frequency;

second loading means coupled to the mixing means and tuned to a predetermined multiple of the operating frequency;

amplifying means configured to receive and amplify the output RF signal from the mixing means; and at least one switching means configured to switch between the first loading means and the second loading means based on a power level of the apparatus.

18. The apparatus of claim 17, wherein the second loading means comprises filtering means to tune the second loading means to the predetermined multiple of the operating frequency.

19. The apparatus of claim 17, further comprising third loading means coupled to the amplifying means and the first loading means, the third loading means configured to convert the output RF signal to a single-ended RF signal.

20. The apparatus of claim 1, further comprising at least one switch configured to switch between the first load and the second load based on a power level of the apparatus.

* * * * *